(12) United States Patent
Wang et al.

(10) Patent No.: US 12,507,460 B2
(45) Date of Patent: Dec. 23, 2025

(54) MV DEVICE AND METHOD FOR MANUFACTURING SAME

(71) Applicant: Shanghai Huali Integrated Circuit Corporation, Shanghai (CN)

(72) Inventors: Qiwei Wang, Shanghai (CN); Tao Liu, Shanghai (CN); Zhigang Zhang, Shanghai (CN); Yaoyu Zhan, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 416 days.

(21) Appl. No.: 18/361,517

(22) Filed: Jul. 28, 2023

(65) Prior Publication Data
US 2024/0096989 A1  Mar. 21, 2024

(30) Foreign Application Priority Data
Sep. 16, 2022  (CN) .......................... 202211129206.5

(51) Int. Cl.
| H10D 64/27 | (2025.01) |
| H10D 30/60 | (2025.01) |
| H10D 84/01 | (2025.01) |
| H10D 84/03 | (2025.01) |
| H10D 84/83 | (2025.01) |

(52) U.S. Cl.
CPC ......... H10D 64/516 (2025.01); H10D 30/605 (2025.01); H10D 84/0144 (2025.01); H10D 84/038 (2025.01); H10D 84/83 (2025.01)

(58) Field of Classification Search
CPC .................................................... H10D 64/516
See application file for complete search history.

(56) References Cited

U.S. PATENT DOCUMENTS

| 10,347,731 B2 * | 7/2019 | Bi ........................ H10D 62/151 |
| 2014/0021534 A1 * | 1/2014 | Verma .................. H10D 84/038 |
| | | 438/270 |

* cited by examiner

*Primary Examiner* — Fernando L Toledo
*Assistant Examiner* — Shawn Shaw Muslim
(74) *Attorney, Agent, or Firm* — Banner & Witcoff, Ltd.

(57) ABSTRACT

The present application discloses an MV device, wherein a first gate structure of the MV device is formed by stacking a first gate dielectric layer and a first gate conductive material layer. The first gate dielectric layer is divided into a body gate dielectric layer and an edge gate dielectric layer. The body gate dielectric layer is located in a middle region, and the edge gate dielectric layer surrounds the periphery of the body gate dielectric layer. A channel region is located in a surface of the semiconductor substrate between the lightly doped drain regions on the two sides of the first gate structure. In a channel length direction, the top of the channel region is covered by the body gate dielectric layer. The present application also discloses a method for manufacturing the MV device.

15 Claims, 8 Drawing Sheets

MV DEVICE AND METHOD FOR MANUFACTURING SAME

CROSS-REFERENCES TO RELATED APPLICATIONS

This application claims the priority to Chinese patent application No. CN202211129206.5, filed on Sep. 16, 2022, and entitled "MV DEVICE AND METHOD FOR MANUFACTURING SAME", the disclosure of which is incorporated herein by reference in entirety.

TECHNICAL FIELD

The present application relates to the field of semiconductor integrated circuit manufacturing, in particular, to a medium voltage (MV) device. The present application also relates to a method for manufacturing an MV device.

BACKGROUND

The 28 nm high-voltage (HV) process includes inserting medium and high voltage devices, i.e., a medium voltage device and a high voltage device, on a 28 HK platform. After inserting the medium and high voltage devices, a low voltage (LV) device, the medium voltage device, and the high voltage device are integrated simultaneously on the same semiconductor substrate. For example, a core device or SRAM device uses the LV device, and an input output (10) device uses the medium voltage device. A working voltage of the LV device reaches a few tenths of a volt to one and a few tenths of a volt, a working voltage of the medium voltage device reaches several volts, such as 8V, and a working voltage of the high voltage device is higher than these. The provision of a field oxide layer is typically required in a drift region of the high voltage device. In an integrated process, the medium voltage device and the core/SRAM device share the same spacer, for example, an 8V MV and a 0.9V core/SRAM share the same spacer. Due to hard constraints of the pitch of the SRAM, the spacer cannot be excessively thick. In the present application, the thickness of the spacer refers to a lateral width of the spacer. Accordingly, a gate induced drain leakage (GIDL) in the MV device can be severe.

Currently, in the industry, the GIDL is improved mainly by adjusting a lightly doped drain (LDD) region of the MV device, but the improvement is limited for its very small window.

FIGS. 1A-1F are schematic diagrams of cross sectional structures in various steps of an existing method for manufacturing an integrated MV device and LV device. The existing method for manufacturing an MV device includes the following steps:

Step 1. Referring to FIG. 1A, a semiconductor substrate 101 is provided, wherein a field oxide layer is formed on the semiconductor substrate 101, and a formation region of the MV device is located in a first active region 101a. In FIG. 1A, a first LV device is also integrated on the semiconductor substrate 101. A working voltage of the MV device is greater than a working voltage of the first LV device. A formation region of the first LV device is located in a second active region 101b.

A second LV device is also integrated on the semiconductor substrate 101. The working voltage of the first LV device is greater than a working voltage of the second LV device. A formation region of the second LV device is located in a third active region 101c.

The first active region 101a, the second active region 101b, and the third active region 101c are all composed of the semiconductor substrate 101 in regions surrounded by the field oxide layer (not shown). For ease of a more intuitive understanding, the first active region 101a, the second active region 101b, and the third active region 101c in FIG. 1A are shown in juxtaposition in the same cross-sectional view. However, the first active region 101a, the second active region 101b, and the third active region 101c may actually be formed in different regions, e.g., adjacent or non-adjacent regions.

Two lightly doped drain regions 102 are formed in selected regions of the first active region 101a.

A channel region 109 is located in a surface region of the semiconductor substrate 101 between the two lightly doped drain regions 102.

Step 2. Referring to FIG. 1A, a first gate dielectric layer 103 is grown, wherein the grown first gate dielectric layer 103 is formed on a surface of the entire semiconductor substrate 101.

Referring to FIG. 1B, a first etching is performed on the first gate dielectric layer 103. After the first etching, the first gate dielectric layer 103 covers a surface of the first active region 101a, and the first gate dielectric layer 103 in both the formation region of the first LV device and the formation region of the second LV device is removed. In FIG. 1B, the first gate dielectric layer undergoing the first etching is also represented by a mark 103.

Step 3. Referring to FIG. 1C, a second gate dielectric layer 104 is grown on second active region 101b, and the third active region 101c, wherein the thickness of the second gate dielectric layer 104 is less than the thickness of a body gate dielectric layer 103.

Referring to FIG. 1D, a second etching is then performed. After the second etching, the second gate dielectric layer 104 in the formation region of the first LV device is retained, and the second gate dielectric layer 104 in the formation region of the second LV device is removed.

Step 4. Referring to FIG. 1E, a third gate dielectric layer 105 is grown on the formation region of the second LV device, wherein the thickness of the third gate dielectric layer 105 is less than the thickness of the second gate dielectric layer 104.

Agate conductive material layer 106 is grown. The gate conductive material layer 106 is formed on the surface of the entire semiconductor substrate 101.

Referring to FIG. 1F, a third etching is performed to form a first gate structure of the MV device, a second gate structure of the first LV device, and a third gate structure of the second LV device simultaneously.

The first gate structure is formed by stacking the first gate dielectric layer 103 and a first gate conductive material layer 1061. Side faces of the first gate structure include a first side face, a second side face, a third side face, and a fourth side face. The first side face and the second side face of the first gate structure are two side faces located in a channel length direction, and the third side face and the fourth side face of the first gate structure are two side faces located in a channel width direction. In FIG. 2B, the channel length direction is along a horizontal direction in a plane shown in FIG. 2B, and the channel width direction corresponds to a vertical direction in the plane shown in FIG. 2B.

Referring to FIG. 2B, the third side face and the fourth side face of the first gate structure also extend to the top of the field oxide layer outside the first active region 101a separately along the channel width direction.

The second gate structure is formed by stacking the second gate dielectric layer 104 and a second gate conductive material layer 1062.

The third gate structure is formed by stacking the third gate dielectric layer 105 and a third gate conductive material layer 1063.

Step 5. Referring to FIG. 1F, a spacer process is performed to simultaneously form the first spacers 1071 on all the side faces of the first gate structure, the second spacers 1072 on all side faces of the second gate structure, and the third spacers 1073 on all side faces of the third gate structure.

The spacer process includes deposition of a spacer dielectric layer and full etching of the spacer dielectric layer.

Typically, in the formation region of the second LV device, the second LV device is arranged repeatedly according to a first pitch, and an integration level is improved by reducing the first pitch. When the first pitch becomes smaller, the thicknesses of the first spacers 1071, the second spacers 1072, and the third spacers 1073 become smaller. Therefore, when the first pitch needs to be reduced to a specific value, the thicknesses of the first spacers 1071, the second spacers 1072, and the third spacers 1073 necessarily need to be reduced to specific values and cannot be further increased. Thus, in the existing method, the thickness of the first spacers 1071 of the MV device is affected by the first pitch of the second LV device. Moreover, when the thickness of the first spacers 1071 of the MV device is reduced, an adverse impact is imposed on the performance of the MV device, e.g., leading to an increased GIDL leakage.

Step 6. Referring to FIG. 1F, a self-aligned source drain implant is performed to form first source drain regions 1081 on surfaces of the lightly doped drain regions 102 outside the first spacers 1071 at the first side face and the second side face of the first gate structure. The source drain implant also simultaneously forms second source drain regions 1082 on surfaces of the semiconductor substrate 101 outside the second spacers 1072 at a first side face and a second side face of the second gate structure, as well as third source drain regions 1083 on surfaces of the semiconductor substrate 101 outside the third spacers 1073 at a first side face and a second side face of the third gate structure.

FIG. 2A is an enlarged view of the MV device in FIG. 1F, and FIG. 2B is a schematic diagram of the top view of the MV device structure shown in FIG. 2A, that is, FIG. 2B is a layout diagram of the existing MV device.

SUMMARY

According to some embodiments in this application, a formation region of the MV device is located in a first active region, and the first active region is composed of a semiconductor substrate in a region surrounded by a field oxide layer. The MV device includes:

a first gate structure, the first gate structure formed by stacking a first gate dielectric layer formed on a surface of the semiconductor substrate and a first gate conductive material layer;

first spacers formed on all side faces of the first gate structure in a self-aligned manner, the side faces of the first gate structure including a first side face, a second side face, a third side face, and a fourth side face, the first side face and the second side face of the first gate structure being two side faces located in a channel length direction, and the third side face and the fourth side face of the first gate structure being two side faces located in a channel width direction;

lightly doped drain regions formed in the semiconductor substrate outside the first side face and the second side face of the first gate structure; and first source drain regions formed on surfaces of the lightly doped drain regions outside the first spacers at the first side face and the second side face of the first gate structure.

The first gate dielectric layer is divided into a body gate dielectric layer and an edge gate dielectric layer, the body gate dielectric layer is located in a middle region of a formation region of the first gate structure, and the edge gate dielectric layer surrounds the periphery of the body gate dielectric layer.

A channel region is located in a surface region of the semiconductor substrate between the lightly doped drain regions on two sides of the first gate structure; at the first side face and the second side face of the first gate structure, the lightly doped drain regions also extend to the bottom of the body gate dielectric layer, and in the channel length direction, the top of the channel region is fully covered by the body gate dielectric layer.

The thickness of the edge gate dielectric layer is greater than the thickness of the body gate dielectric layer, a threshold voltage of the MV device is determined by the thickness of the body gate dielectric layer, and by increasing the thickness of the edge gate dielectric layer, a leakage of the MV device is reduced without an impact on the threshold voltage of the MV device.

In some cases, a growth thickness of the first gate dielectric layer is the thickness of the edge gate dielectric layer, and the thickness of the body gate dielectric layer is obtained by reducing a portion of the growth thickness of the first gate dielectric layer via an etching process.

In some cases, the third side face and the fourth side face of the first gate structure also extend to the top of the field oxide layer outside the first active region separately along the channel width direction, the body gate dielectric layer is located in the active region, and the edge gate dielectric layer is located on a surface of the active region between an outer edge of the body gate dielectric layer and an outer edge of the active region.

In some cases, a first LV device is also integrated on the semiconductor substrate; a working voltage of the MV device is greater than a working voltage of the first LV device.

A second gate structure of the first LV device is formed by stacking a second gate dielectric layer and a second gate conductive material layer; second spacers are formed on side faces of the second gate structure.

A process of the second spacers is the same as that of the first spacers.

A process of the second gate conductive material layer is the same as that of the first gate conductive material layer.

The thickness of the second gate dielectric layer is less than the thickness of the body gate dielectric layer.

The second gate dielectric layer undergoes a etching, an etching process for reducing the thickness of the body gate dielectric layer adopts a etching process of the second gate dielectric layer, and a difference between the thickness of the edge gate dielectric layer and the thickness of the body gate dielectric layer is greater than or equal to the thickness of the second gate dielectric layer.

In some cases, a second LV device is also integrated on the semiconductor substrate; a working voltage of the first LV device is greater than a working voltage of the second LV device.

A third gate structure of the second LV device is formed by stacking a third gate dielectric layer and a third gate conductive material layer; third spacers are formed on side faces of the third gate structure.

A process of the third spacers is the same as that of the first spacers.

A process of the third gate conductive material layer is the same as that of the first gate conductive material layer.

The thickness of the third gate dielectric layer is less than the thickness of the second gate dielectric layer.

In some cases, in a formation region of the second LV device, the second LV device is repeatedly arranged according to a first pitch, an integration level is improved by reducing the first pitch, and when the first pitch becomes smaller, the thicknesses of the first spacers, the second spacers, and the third spacers become smaller.

In some cases, a material of the first gate dielectric layer includes an oxide layer.

A material of the second gate dielectric layer includes an oxide layer.

A material of the third gate dielectric layer includes an oxide layer.

In some cases, the first gate conductive material layer includes a polysilicon gate.

In order to solve the above technical problem, the method for manufacturing an MV device provided by the present application includes the following steps:

step 1, providing a semiconductor substrate, wherein a field oxide layer is formed on the semiconductor substrate, a formation region of the MV device is located in a first active region, and the first active region is composed of the semiconductor substrate in a region surrounded by the field oxide layer; two lightly doped drain regions are formed in selected regions of the first active region;

a channel region is located is located in a surface region of the semiconductor substrate between the two lightly doped drain regions;

step 2, growing a first gate dielectric layer, and performing a first etching on the first gate dielectric layer, wherein after the first etching, the first gate dielectric layer covers a surface of the first active region;

step 3, performing a second etching, wherein the second etching reduces the thickness of the first gate dielectric layer in a selected region and divides the first gate dielectric layer into a body gate dielectric layer and an edge gate dielectric layer, the body gate dielectric layer is composed of the thinned first gate dielectric layer and located in a middle region of a formation region of a first gate structure, the edge gate dielectric layer is composed of the non-thinned first gate dielectric layer, and the edge gate dielectric layer surrounds the periphery of the body gate dielectric layer;

along a channel length direction, the two lightly doped drain regions extend to the bottom of the body gate dielectric layer separately, and the top of the channel region is fully covered by the body gate dielectric layer;

a threshold voltage of the MV device is determined by the thickness of the body gate dielectric layer, and by increasing the thickness of the edge gate dielectric layer, a leakage of the MV device is reduced without an impact on the threshold voltage of the MV device;

step 4, growing a gate conductive material layer, and performing a third etching, wherein in the formation region of the MV device, the gate conductive material layer and the first gate dielectric layer are both located in the formation region of the first gate structure after the third etching, the gate conductive material layer in the formation region of the first gate structure serves as a first gate conductive material layer, and the first gate structure is formed by stacking the first gate dielectric layer and the first gate conductive material layer;

side faces of the first gate structure include a first side face, a second side face, a third side face, and a fourth side face, the first side face and the second side face of the first gate structure are two side faces located in the channel length direction, and the third side face and the fourth side face of the first gate structure are two side faces located in a channel width direction;

step 5, performing a spacer process to form first spacers on all the side faces of the first gate structure; and step 6, performing a self-aligned source drain implant to form first source drain regions on surfaces of the lightly doped drain regions outside the first spacers at the first side face and the second side face of the first gate structure.

In some cases, the third side face and the fourth side face of the first gate structure also extend to the top of the field oxide layer outside the first active region separately along the channel width direction in step 4, the body gate dielectric layer is located in the active region, and the edge gate dielectric layer is located on a surface of the active region between an outer edge of the body gate dielectric layer and an outer edge of the active region.

In some cases, a first LV device is also integrated on the semiconductor substrate; a working voltage of the MV device is greater than a working voltage of the first LV device.

The first gate dielectric layer in a formation region of the first LV device is removed after the first etching in step 2.

The method further includes growing a second gate dielectric layer before step 3, wherein the thickness of the second gate dielectric layer is less than the thickness of the body gate dielectric layer; then step 3 is performed, wherein the second etching in step 3 simultaneously etches the second gate dielectric layer, and the second gate dielectric layer in the formation region of the first LV device is retained after the second etching.

In step 4, the gate conductive material layer and the second gate dielectric layer in the formation region of the first LV device are both located in a formation region of a second gate structure of the first LV device after the third etching, the gate conductive material layer located in the formation region of the second gate structure serves as a second gate conductive material layer, and the second gate structure is formed by stacking the second gate dielectric layer and the second gate conductive material layer.

The spacer process in step 5 simultaneously forms second spacers on all side faces of the second gate structure.

The source drain implant in step 6 simultaneously forms second source drain regions on surfaces of the semiconductor substrate outside the second spacers at a first side face and a second side face of the second gate structure.

In some cases, a second LV device is also integrated on the semiconductor substrate; a working voltage of the first LV device is greater than a working voltage of the second LV device.

The first gate dielectric layer in a formation region of the second LV device is removed after the first etching in step 2.

The second gate dielectric layer in the formation region of the second LV device is removed after the second etching in step 3.

The method further includes growing a third gate dielectric layer after step 3 and before step 4, wherein the thickness of the third gate dielectric layer is less than the thickness of the second gate dielectric layer.

In step 4, the gate conductive material layer and the third gate dielectric layer in the formation region of the second LV device are both located in a formation region of a third gate structure of the second LV device after the third etching, the gate conductive material layer located in the formation region of the third gate structure serves as a third gate conductive material layer, and the third gate structure is formed by stacking the third gate dielectric layer and the third gate conductive material layer.

The spacer process in step 5 simultaneously forms third spacers on all side faces of the third gate structure.

The source drain implant in step 6 simultaneously forms third source drain regions on surfaces of the semiconductor substrate outside the third spacers at a first side face and a second side face of the third gate structure.

In some cases, in the formation region of the second LV device, the second LV device is repeatedly arranged according to a first pitch, an integration level is improved by reducing the first pitch, and when the first pitch becomes smaller, the thicknesses of the first spacers, the second spacers, and the third spacers become smaller.

In some cases, a material of the first gate dielectric layer includes an oxide layer.

A material of the second gate dielectric layer includes an oxide layer.

A material of the third gate dielectric layer includes an oxide layer.

In some cases, the gate conductive material layer in step 4 includes a polysilicon gate.

Regarding the technical problem of the limited thickness of the first spacers in the MV device, which is easy to cause a leakage such as a GIDL leakage, the present application improves a process of the first gate dielectric layer of the first gate structure of the MV device. The first gate dielectric layer is configured as the body gate dielectric layer located in the middle region and the edge gate dielectric layer located on the periphery of the body gate dielectric layer. The body gate dielectric layer fully covers the channel region between the first source drain regions on the two sides of the first gate structure, so that the threshold voltage of the MV device is determined solely by the body gate dielectric layer and is not affected by the edge gate dielectric layer. Since the thickness of the body gate dielectric layer is configured to be relatively small, the threshold voltage of the MV device can be reduced, increasing the control of the first gate conductive material layer on the channel region of the MV device, thereby reducing an on-resistance and increasing an on-current of the device. As such, a speed of the MV device can be maintained or improved by adjusting the thickness of the body gate dielectric layer. Since the thickness of the edge gate dielectric layer is configured to be relatively large, the thickness of an isolation layer between the first gate conductive material layer and the first source drain region can be increased, eliminating an adverse impact of a reduction of the thickness of the first spacers on the device leakage, and ultimately reducing a leakage current of the MV device, e.g., reducing a GIDL leakage current.

Moreover, the MV device of the present application is typically integrated with LV devices. After a structure of the first gate dielectric layer is grown to reach the thickness of the edge gate dielectric layer, the etching process of the second gate dielectric layer of the integrated LV device, e.g., the first LV device, can be used to thin the first gate dielectric layer to form the body gate dielectric layer. As such, the body gate dielectric layer of the present application causes no additional process costs, i.e., requiring no additional lithography process for definition. Therefore, the present application also has the advantages of a simple integration process and low process costs.

Furthermore, in the present application, along the channel width direction, the edge gate dielectric layer is located on the surface of the active region between the outer edge of the body gate dielectric layer and the outer edge of the active region, that is, the edge gate dielectric layer is located on a surface of an edge region of the active region, thereby reducing a leakage of the edge region of the active region and further reducing the leakage of the MV device.

In addition, the present application can also reduce the gate source capacitance and the gate drain capacitance.

BRIEF DESCRIPTION OF THE DRAWINGS

The present application is further described in detail below in conjunction with the drawings and specific implementations.

DETAILED DESCRIPTION OF THE DISCLOSURE

Figure 3A:
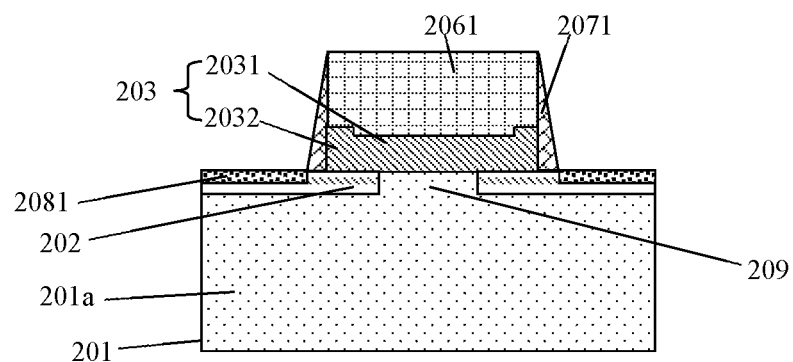
FIG. 3A is a schematic diagram of a cross-sectional view of an MV device structure in embodiments of the present application.
Figure 3B:
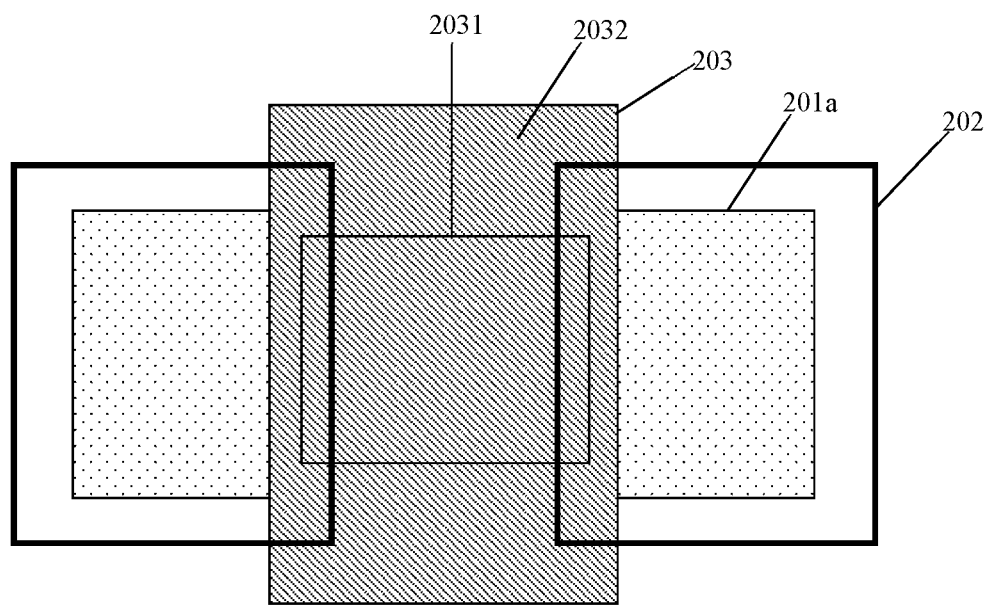
FIG. 3B is a schematic diagram of a top view of the MV device structure shown in FIG. 3A.

FIG. 3A is a schematic diagram of a sectional structure of an MV device according to embodiments of the present application. FIG. 3B is a schematic diagram of a top view structure, i.e., a layout, of the MV device shown in FIG. 3A. A formation region of the MV device in this embodiment of the present application is located in a first active region 201a, and the first active region 201a is composed of a semiconductor substrate 201 surrounded by a field oxide layer. The MV device includes:

a first gate structure, the first gate structure formed by stacking a first gate dielectric layer 203 formed on a surface of the semiconductor substrate 201 and a first gate conductive material layer 2061;

first spacers 2071 formed on all side faces of the first gate structure in a self-aligned manner, the side faces of the first gate structure including a first side face, a second side face, a third side face, and a fourth side face, the first side face and the second side face of the first gate structure being two side faces located in a channel length direction, and the third side face and the fourth side face of the first gate structure being two side faces located in a channel width direction;

lightly doped drain regions 202 formed in the semiconductor substrate 201 outside the first side face and the second side face of the first gate structure; and first source drain regions 2081 formed on surfaces of the lightly doped drain regions 202 outside the first spacers 2071 at the first side face and the second side face of the first gate structure. In FIG. 3A, the first source drain regions 2081 on two sides of the first gate structure present a symmetrical structure, with one serving as a source region and the other as a drain region.

The first gate dielectric layer 203 is divided into a body gate dielectric layer 2031 and an edge gate dielectric layer 2032. The body gate dielectric layer 2031 is located in a middle region of a formation region of the first gate structure, and the edge gate dielectric layer 2032 surrounds the periphery of the body gate dielectric layer 2031.

A channel region 209 is located in a surface region of the semiconductor substrate 201 between the lightly doped drain regions 202 on the two sides of the first gate structure. At the first side face and the second side face of the first gate structure, the lightly doped drain regions 202 also extend to the bottom of the body gate dielectric layer 2031. In the channel length direction, the top of the channel region 209 is fully covered by the body gate dielectric layer 2031.

The thickness of the edge gate dielectric layer 2032 is greater than the thickness of the body gate dielectric layer 2031. A threshold voltage of the MV device is determined by the thickness of the body gate dielectric layer 2031. By increasing the thickness of the edge gate dielectric layer 2032, a leakage of the MV device is reduced without an impact on the threshold voltage of the MV device.

In this embodiment of the present application, a growth thickness of the first gate dielectric layer 203 is the thickness of the edge gate dielectric layer 2032, and the thickness of the body gate dielectric layer 2031 is obtained by reducing a portion of the growth thickness of the first gate dielectric layer 203 via an etching process.

The third side face and the fourth side face of the first gate structure also extend to the top of the field oxide layer outside the first active region 201a separately along the channel width direction. The body gate dielectric layer 2031 is located in the active region, and the edge gate dielectric layer 2032 is located on a surface of the active region between an outer edge of the body gate dielectric layer 2031 and an outer edge of the active region. Therefore, the edge gate dielectric layer 2032 of this embodiment of the present application can simultaneously increase the thickness of the first gate dielectric layer 203 at two side edges in the channel length direction. FIG. 3A is a diagram of a sectional structure along the channel length direction. As such, an increase of the thickness of the first gate dielectric layer 203 at the two side edges in the channel length direction leads to an increase of the thickness of the first spacers 2071, thereby reducing a GIDL leakage of the device. This embodiment of the present application can also increase the thickness of the first gate dielectric layer 203 at two side edges in the channel width direction, i.e., edges of the active region. Since the edges of the active region in the channel width direction are also prone to generation of a leakage, e.g., a subthreshold current leakage, this embodiment of the present application can further reduce the device leakage by increasing the thickness of the first gate dielectric layer 203 at the edges of the active region.

Figure 4A:
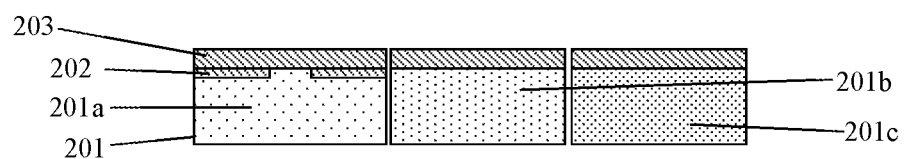
FIGS. 4A-4F are schematic diagrams of cross-sectional view of an integrated MV and LV device structure at various steps during its manufacturing in an embodiment of the present application.
Figure 4B:
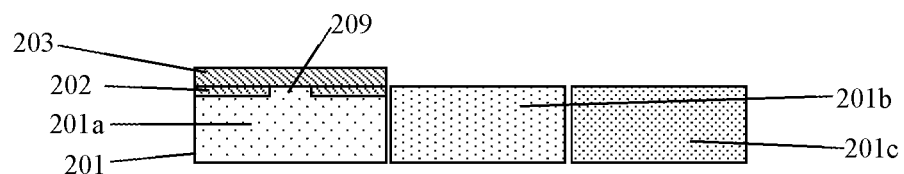
Figure 4C:
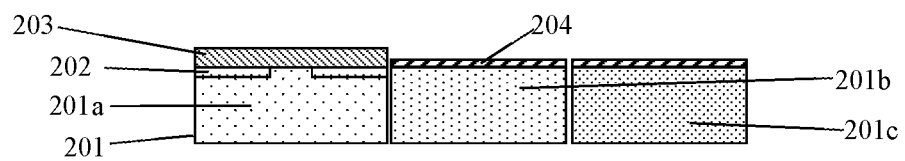
Figure 4D:
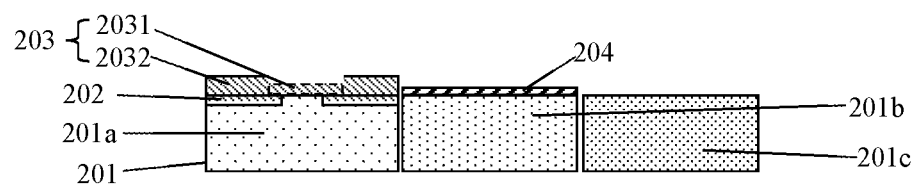
Figure 4E:
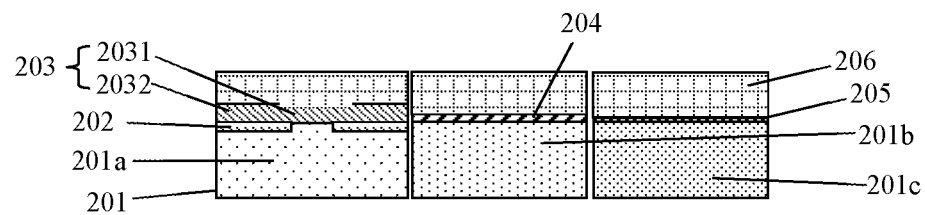
Figure 4F:
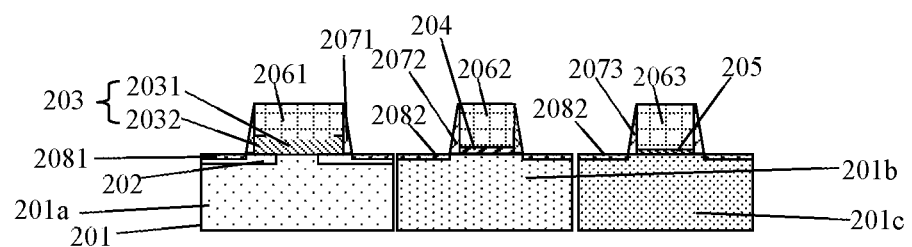

Referring to FIG. 4F, in some embodiments, a first LV device is also integrated on the semiconductor substrate 201. A working voltage of the MV device is greater than a working voltage of the first LV device. In FIG. 4F, the first LV device is formed in a second active region 201b, and the second active region 201b is also formed by surrounding and isolating the semiconductor substrate 201 via the field oxide layer.

A second gate structure of the first LV device is formed by stacking a second gate dielectric layer 204 and a second gate conductive material layer 2062. Second spacers 2072 are formed on side faces of the second gate structure. A process of the second spacers 2072 is the same as that of the first spacers 2071.

A process of the second gate conductive material layer 2062 is the same as that of the first gate conductive material layer 2061.

Second source drain regions 2082 self-aligned with the second spacers 2072 are also formed on two sides of the second gate structure.

A process of the first source drain region 2081 is the same as that of the second source drain region 2082.

The thickness of the second gate dielectric layer 204 is less than the thickness of the body gate dielectric layer 2031.

In some embodiments, the second gate dielectric layer 204 undergoes a etching. An etching process for reducing the thickness of the body gate dielectric layer 2031 adopts a etching process of the second gate dielectric layer 204. A difference between the thickness of the edge gate dielectric layer 2032 and the thickness of the body gate dielectric layer 2031 is greater than or equal to the thickness of the second gate dielectric layer 204.

A second LV device is also integrated on the semiconductor substrate 201. A working voltage of the first LV device is greater than a working voltage of the second LV device. In FIG. 4F, the second LV device is formed in a third active region 201c, and the third active region 201c is also formed by surrounding and isolating the semiconductor substrate 201 via the field oxide layer.

A third gate structure of the second LV device is formed by stacking a third gate dielectric layer 205 and a third gate conductive material layer 2063. Third spacers 2073 are formed on side faces of the third gate structure.

A process of the third spacers 2073 is the same as that of the first spacers 2071.

A process of the third gate conductive material layer 2063 is the same as that of the first gate conductive material layer 2061.

Third source drain regions 2083 self-aligned with the third spacers 2073 are also formed on two sides of the third gate structure.

A process of the first source drain region 2081 is the same as that of the third source drain region 2083.

The thickness of the third gate dielectric layer 205 is less than the thickness of the second gate dielectric layer 204.

In a formation region of the second LV device, the second LV device is repeatedly arranged according to a first pitch. An integration level is improved by reducing the first pitch, and when the first pitch becomes smaller, the thicknesses of the first spacers 2071, the second spacers 2072, and the third spacers 2073 become smaller.

A material of the first gate dielectric layer 203 includes an oxide layer.

A material of the second gate dielectric layer 204 includes an oxide layer.

A material of the third gate dielectric layer 205 includes an oxide layer.

The first gate conductive material layer 2061 includes a polysilicon gate.

Regarding the technical problem of the limited thickness of the first spacers 2071 in the MV device, which is easy to cause a leakage such as a GIDL leakage, this embodiment of the present application improves a process of the first gate dielectric layer 203 of the first gate structure of the MV device. The first gate dielectric layer 203 is configured as the body gate dielectric layer 2031 located in the middle region and the edge gate dielectric layer 2032 located on the periphery of the body gate dielectric layer 2031. The body gate dielectric layer 2031 fully covers the channel region 209 between the first source drain regions 2081 on the two sides of the first gate structure, so that the threshold voltage of the MV device is determined solely by the body gate dielectric layer 2031 and is not affected by the edge gate dielectric layer 2032. Since the thickness of the body gate dielectric layer 2031 is configured to be relatively small, the threshold voltage of the MV device can be reduced, increasing the control of the first gate conductive material layer on 2061 the channel region 209 of the MV device, thereby reducing an on-resistance and increasing an on-current of the device. As such, a speed of the MV device can be maintained or improved by adjusting the thickness of the body gate dielectric layer 2031. Since the thickness of the edge gate dielectric layer 2032 is configured to be relatively large, the thickness of an isolation layer between the first gate conductive material layer 2061 and the first source drain region 2081 can be increased, eliminating an adverse impact of a reduction of the thickness of the first spacers 2071 on the device leakage, and ultimately reducing a leakage current of the MV device, e.g., reducing a GIDL leakage current.

Moreover, the MV device of this embodiment of the present application is typically integrated with LV devices. After a structure of the first gate dielectric layer 203 is grown to reach the thickness of the edge gate dielectric layer 2032, the etching process of the second gate dielectric layer 204 of the integrated LV device, e.g., the first LV device, can be used to thin the first gate dielectric layer 203 to form the body gate dielectric layer 2031. As such, the body gate dielectric layer 2031 of this embodiment of the present application causes no additional process costs, i.e., requiring no additional lithography process for definition. Therefore, this embodiment of the present application also has the advantages of a simple integration process and low process costs.

Furthermore, in this embodiment of the present application, along the channel width direction, the edge gate dielectric layer 2032 is located on the surface of the active region between the outer edge of the body gate dielectric layer 2031 and the outer edge of the active region, that is, the edge gate dielectric layer 2032 is located on a surface of an edge region of the active region, thereby reducing a leakage of the edge region of the active region and further reducing the leakage of the MV device.

In addition, this embodiment of the present application can also reduce a gate source capacitance and a gate drain capacitance.

In some embodiments, the working voltage of the MV device is 8 V, the working voltage of the first LV device is 1.2 V, and the working voltage of the second LV device is 0.9 V.

Figure 1A:
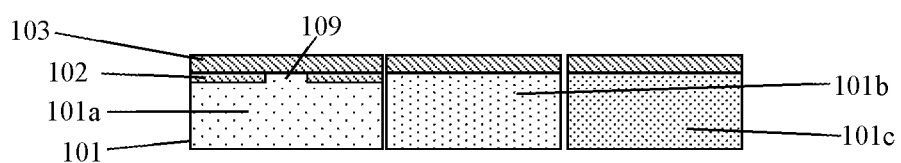
FIGS. 1A-1F are schematic diagrams of cross-sectional structures at various steps of an existing method for manufacturing an integrated MV device and LV device.
Figure 1B:
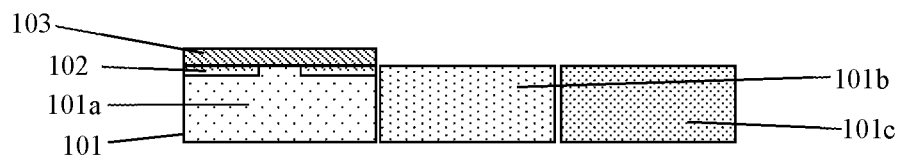
Figure 1C:
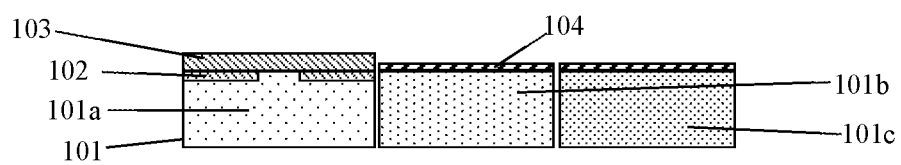
Figure 1D:
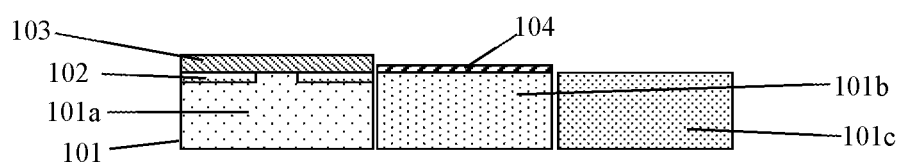
Figure 1E:
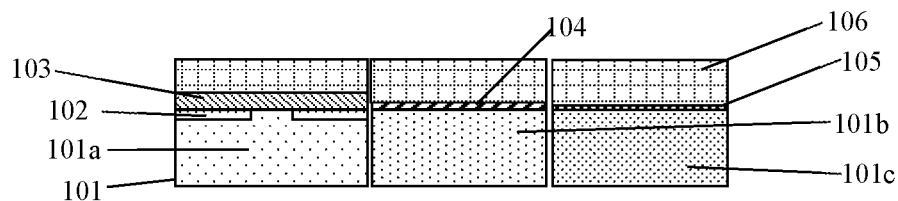
Figure 1F:
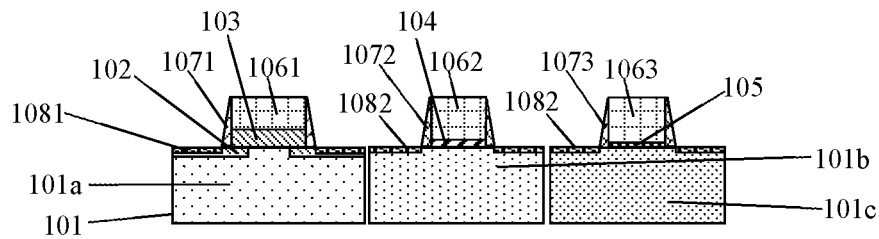
Figure 2A:
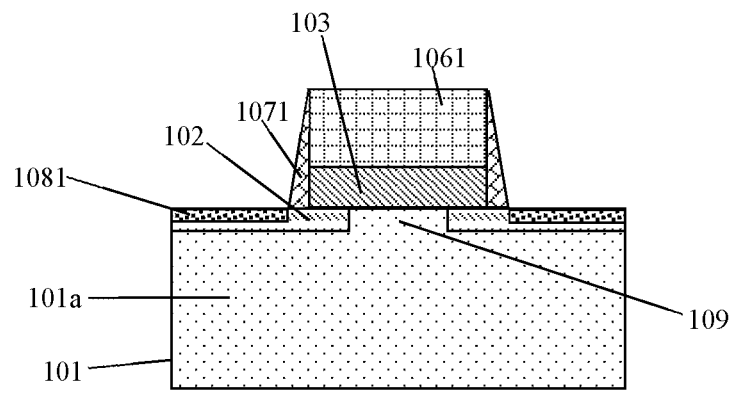
FIG. 2A is a schematic diagram of a cross-sectional view of the MV device structure formed by the existing method for manufacturing an integrated MV device and LV device.
Figure 2B:
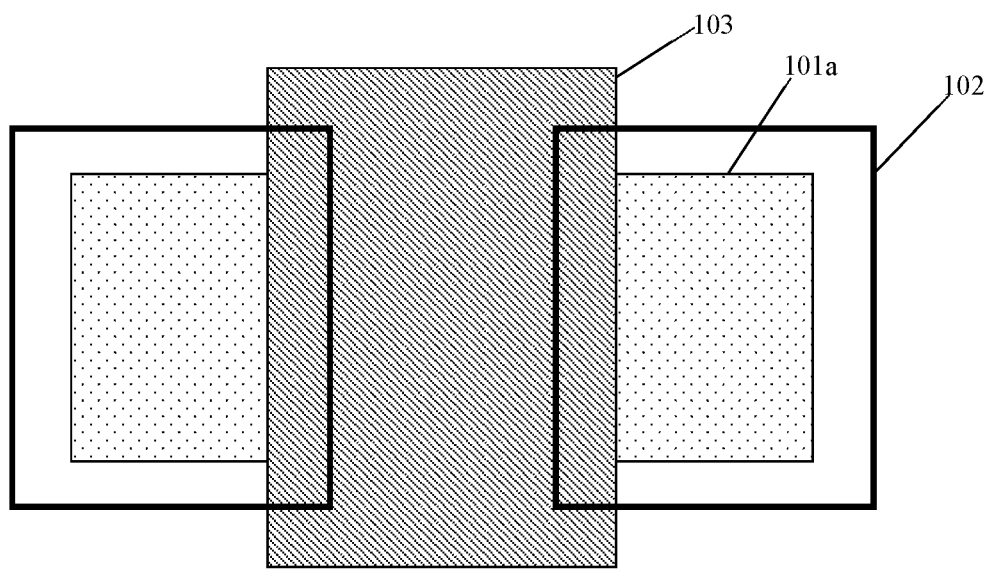
FIG. 2B is a schematic diagram of a top view of the MV device structure shown in FIG. 2A.
Figure 5A:
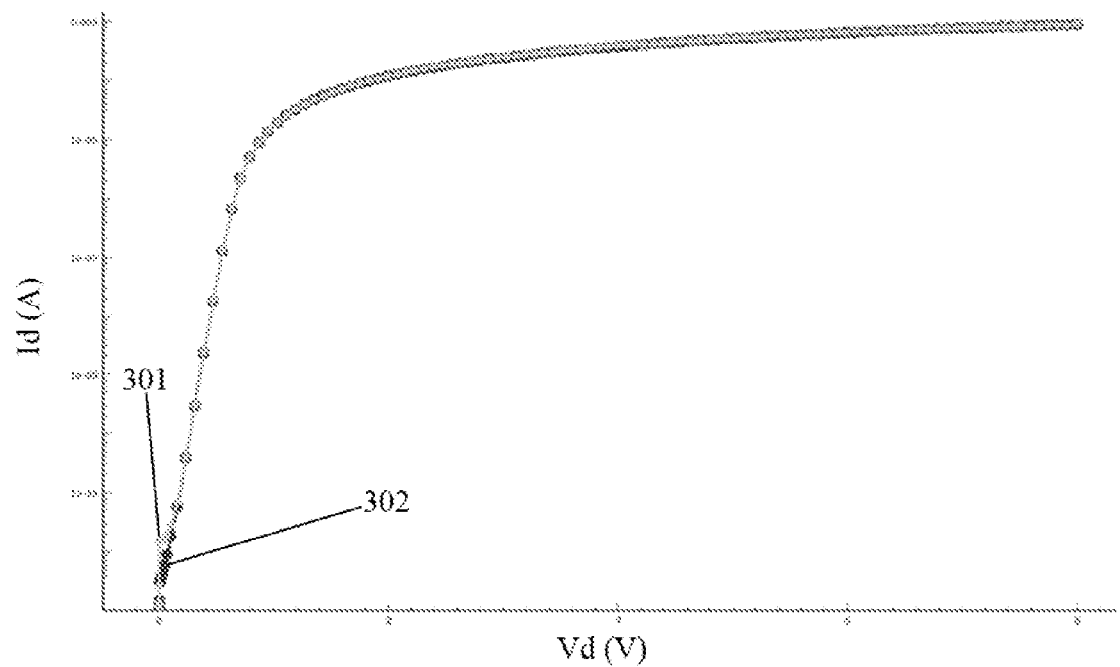
FIG. 5A is a chart comparing the switch-on output characteristic curves between the MV device according to the present application and the existing MV device.

FIG. 5A is a chart comparing the switch-on output characteristic curves between the MV device according to the present application and the existing MV device. The existing MV device adopts a structure shown in FIG. 2A, and the thickness of a first gate dielectric layer 103 of the existing MV device is the same as the thickness of the body gate dielectric layer 2031 of the MV device of this embodiment of the present application. In FIG. 5A, the MV device of this embodiment of the present application and the existing MV device are both NMOS s having the same working voltage of 8 V and having the same working condition, i.e., both having the same gate voltage, with sources being grounded and gate source voltages being greater than threshold voltages. An output characteristic curve is a curve of a drain current changing with a drain voltage. A curve 301 is a switch-on output characteristic curve of the existing MV device, and a curve 302 is a switch-on output characteristic curve of the MV device of this embodiment of the present application. It can be seen that curves 301 and 302 substantially coincide, indicating that threshold voltages as well as protection currents of both MV devices are substantially the same and operation speeds are also substantially the same.

Figure 5B:
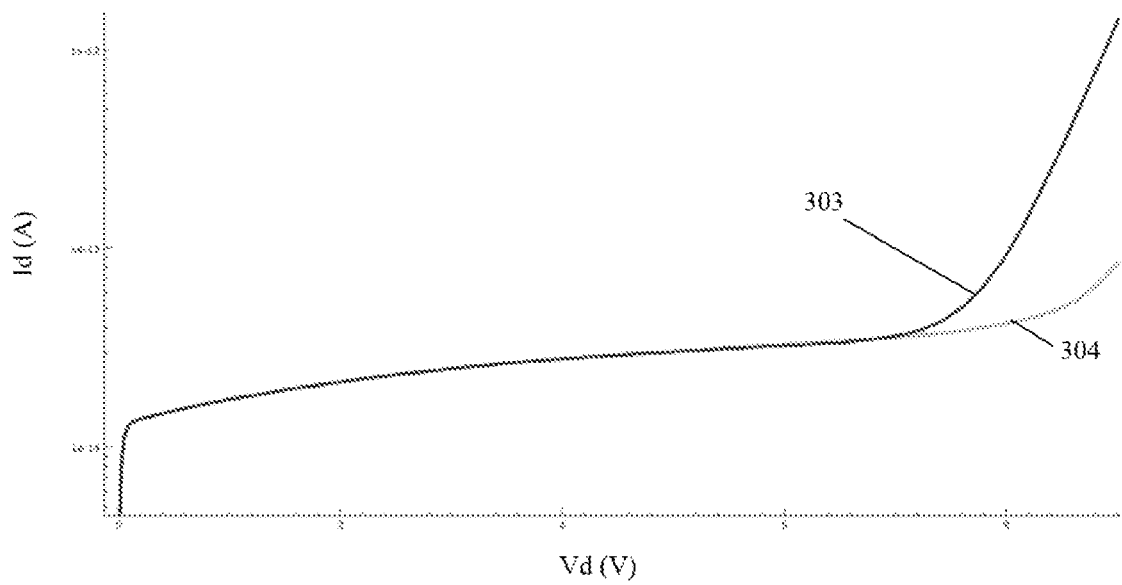
FIG. 5B is chart comparing the switch-off output characteristic curves between the MV device according to the present application and the existing MV device.

FIG. 5B is chart comparing the switch-off output characteristic curves between the MV device according to the present application and the existing MV device. In FIG. 5B, the MV device of this embodiment of the present application and the existing MV device have the same gate voltage, with sources being grounded and gate source voltages less than threshold voltages. A curve 303 is a switch-off output characteristic curve of the existing MV device, and a curve 304 is a switch-off output characteristic curve of the MV device of this embodiment of the present application. It can be seen that as the drain voltage increases, a drain current of the curve 303 increases quickly. At about 8 V, the drain current of the curve 303 is increased significantly. A drain current at a switch-off moment is a leakage current, and such the leakage current is mainly a GIDL leakage current. Therefore, this embodiment of the present application can reduce the GIDL leakage.

FIGS. 4A-4F are schematic diagrams of sectional structures in various steps of a method for manufacturing an integrated MV device and LV device in embodiments of the present application. The method for manufacturing an MV device in this embodiment of the present application includes the following steps:

Step 1. Referring to FIG. 4A, a semiconductor substrate 201 is provided, wherein a field oxide layer is formed on the semiconductor substrate 201, and a formation region of the MV device is located in a first active region 201*a*. In the method of this embodiment of the present application, a first LV device is also integrated on the semiconductor substrate 201. A working voltage of the MV device is greater than a working voltage of the first LV device. A formation region of the first LV device is located in a second active region 201*b*.

A second LV device is also integrated on the semiconductor substrate 201. A working voltage of the first LV device is greater than a working voltage of the second LV device. A formation region of the second LV device is located in a third active region 201*c*.

The first active region 201*a*, the second active region 201*b*, and the third active region 201*c* are all composed of the semiconductor substrate 201 in regions surrounded by a field oxide layer (not shown). For ease of a more intuitive understanding, the first active region 201a, the second active region 201b, and the third active region 201c in FIG. 4A are shown in juxtaposition in the same cross-sectional view. However, the first active region 201a, the second active region 201b, and the third active region 201c may actually be formed in different regions, e.g., adjacent or non-adjacent regions.

Two lightly doped drain regions 202 are formed in selected regions of the first active region 201a.

A channel region 209 is located in a surface region of the semiconductor substrate 201 between the two lightly doped drain regions 202.

Step 2. Referring to 4A, a first gate dielectric layer 203 is grown, wherein the grown first gate dielectric layer 203 is formed on a surface of the entire semiconductor substrate 201.

In the method of some embodiments, a material of the first gate dielectric layer 203 includes an oxide layer.

Referring to 4B, a first etching is performed on the first gate dielectric layer 203. The first gate dielectric layer 203 covers a surface of the first active region 201a after the first etching. In FIG. 4B, the first gate dielectric layer undergoing the first etching is also represented by a mark 203.

In the method of this embodiment of the present application, the first gate dielectric layer 203 in the formation region of the first LV device is removed after the first etching.

The first gate dielectric layer 203 in the formation region of the second LV device is removed.

Step 3. Referring to FIG. 4D, a second etching is performed, wherein the second etching reduces the thickness of the first gate dielectric layer 203 in a selected region and divides the first gate dielectric layer 203 into a body gate dielectric layer 2031 and an edge gate dielectric layer 2032, the body gate dielectric layer 2031 is composed of the thinned first gate dielectric layer 203 and located in a middle region of a formation region of a first gate structure, the edge gate dielectric layer 2032 is composed of the non-thinned first gate dielectric layer 203, and the edge gate dielectric layer 2032 surrounds the periphery of the body gate dielectric layer 2031.

The method of this embodiment of the present application further includes, referring to FIG. 4C, growing a second gate dielectric layer 204 before step 3, wherein the thickness of the second gate dielectric layer 204 is less than the thickness of the body gate dielectric layer 2031. Then step 3 is performed, referring to FIG. 4D, wherein the second etching in step 3 simultaneously etches the second gate dielectric layer 204, and the second gate dielectric layer 204 in the formation region of the first LV device is retained after the second etching. The second gate dielectric layer 204 in the formation region of the second LV device is removed.

In the method of some embodiments, the material of the second gate dielectric layer 204 includes an oxide layer.

Along a channel length direction, the two lightly doped drain regions 202 extend to the bottom of the body gate dielectric layer 2031 separately, and the top of the channel region 209 is fully covered by the body gate dielectric layer 2031.

A threshold voltage of the MV device is determined by the thickness of the body gate dielectric layer 2031, and by increasing the thickness of the edge gate dielectric layer 2032, a leakage of the MV device is reduced without an impact on the threshold voltage of the MV device.

The method further includes, after step 3 and before step 4:

referring to FIG. 4E, growing a third gate dielectric layer 205, wherein the thickness of the third gate dielectric layer 205 is less than the thickness of the second gate dielectric layer 204.

In the method of some embodiments, the material of the third gate dielectric layer 205 includes an oxide layer.

Step 4. Referring to FIG. 4E, a gate conductive material layer 208 is grown. The gate conductive material layer 206 is formed on the surface of the entire semiconductor substrate 201.

In the method of some embodiments, the material of the gate conductive material layer 206 includes a polysilicon gate.

Referring to FIG. 4F, a third etching is performed.

In the formation region of the MV device, the gate conductive material layer 206 and the first gate dielectric layer 203 are both located in the formation region of the first gate structure after the third etching. The gate conductive material layer 206 in the formation region of the first gate structure serves as a first gate conductive material layer 2061. The first gate structure is formed by stacking the first gate dielectric layer 203 and the first gate conductive material layer 2061.

Side faces of the first gate structure include a first side face, a second side face, a third side face, and a fourth side face. The first side face and the second side face of the first gate structure are two side faces located in the channel length direction, and the third side face and the fourth side face of the first gate structure are two side faces located in a channel width direction.

Referring to FIG. 3B, the third side face and the fourth side face of the first gate structure also extend to the top of the field oxide layer outside the first active region 201a separately along the channel width direction. The body gate dielectric layer 2031 is located in the active region, and the edge gate dielectric layer 2032 is located on a surface of the active region between an outer edge of the body gate dielectric layer 2031 and an outer edge of the active region.

In the method of this embodiment of the present application, the gate conductive material layer 206 and the second gate dielectric layer 204 in the formation region of the first LV device are both located in a formation region of a second gate structure of the first LV device after the third etching. The gate conductive material layer 206 located in the formation region of the second gate structure serves as a second gate conductive material layer 2062. The second gate structure is formed by stacking the second gate dielectric layer 204 and the second gate conductive material layer 2062.

The gate conductive material layer 206 and the third gate dielectric layer 205 in the formation region of the second LV device are both located in a formation region of a third gate structure of the second LV device after the third etching. The gate conductive material layer 206 located in the formation region of the third gate structure serves as a third gate conductive material layer 2063. The third gate structure is formed by stacking the third gate dielectric layer 205 and the third gate conductive material layer 2063.

Step 5. A spacer process is performed to form the first spacers 2071 on all the side faces of the first gate structure.

In the method of this embodiment of the present application, the spacer process simultaneously forms the second spacers 2072 on all side faces of the second gate structure and simultaneously forms third spacers 2073 on all side faces of the third gate structure.

The spacer process includes deposition of a spacer dielectric layer and full etching of the spacer dielectric layer.

In the method of this embodiment of the present application, in the formation region of the second LV device, the second LV device is repeatedly arranged according to a first pitch. An integration level is improved by reducing the first pitch, and when the first pitch becomes smaller, the thicknesses of the first spacers 2071, the second spacers 2072, and the third spacers 2073 become smaller. Therefore, when the first pitch needs to be reduced to a specific value, the thicknesses of the first spacers 2071, the second spacers 2072, and the third spacers 2073 necessarily need to be reduced to specific amounts and cannot be further increased. Thus, in the method of this embodiment of the present application, the thickness of the first spacers 2071 of the MV device is affected by the first pitch of the second LV device.

Step 6. A self-aligned source drain implant is performed to form first source drain regions on surfaces of the lightly doped drain regions 202 outside the first spacers 2071 at the first side face and the second side face of the first gate structure.

In the method of this embodiment of the present application, the source drain implant simultaneously forms second source drain regions 2082 on surfaces of the semiconductor substrate 201 outside the second spacers 2072 at a first side face and a second side face of the second gate structure and simultaneously forms third source drain regions 2083 on surfaces of the semiconductor substrate 201 outside the third spacers 2073 at a first side face and a second side face of the third gate structure.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. An medium voltage (MV) device, comprising:
a semiconductor substrate having a first active region, wherein the first active region is surrounded by a field oxide layer; a first gate structure, comprising a first gate dielectric layer and a first gate conductive material layer stacked on a surface of the semiconductor substrate, and a channel region, wherein the channel region comprises a channel width direction and a channel length direction;
first spacers, arranged on side faces of the first gate structure in a self-aligned manner, wherein the side faces of the first gate structure comprises a first side face, a second side face, a third side face, and a fourth side face, wherein the first side face and the second side face of the first gate structure are arranged in the channel length direction, and wherein the third side face and the fourth side face of the first gate structure are arranged in the channel width direction;
lightly doped drain regions, arranged in the semiconductor substrate outside the first side face and the second side face of the first gate structure; and
first source drain regions, arranged on surfaces of the lightly doped drain regions outside the first spacers at the first side face and the second side face of the first gate structure;
wherein the first gate dielectric layer is divided into a body gate dielectric layer and an edge gate dielectric layer, wherein the body gate dielectric layer is located in a middle region of the first gate structure, and wherein the edge gate dielectric layer surrounds a periphery of the body gate dielectric layer;
wherein the channel region is arranged on a surface of the semiconductor substrate between the lightly doped drain regions which are located on two sides of the first gate structure;
wherein at the first side face and the second side face of the first gate structure, the lightly doped drain regions extend to a bottom of the body gate dielectric layer, and wherein in the channel length direction, a top of the channel region is covered by the body gate dielectric layer;
wherein a thickness of the edge gate dielectric layer is greater than a thickness of the body gate dielectric layer; wherein a threshold voltage of the MV device is determined by the thickness of the body gate dielectric layer, and
wherein by increasing the thickness of the edge gate dielectric layer, a leakage of the MV device is reduced without an impact on the threshold voltage of the MV device.

2. The MV device according to claim 1, wherein a middle portion of the first gate dielectric layer is etched to obtain the thickness of the body gate dielectric layer.

3. The MV device according to claim 2, wherein the third side face and the fourth side face of the first gate structure extend to a top of the field oxide layer outside the first active region respectively along the channel width direction, wherein the body gate dielectric layer is located in the active region, and the edge gate dielectric layer is located on a surface of the active region between an outer edge of the body gate dielectric layer and an outer edge of the active region.

4. The MV device according to claim 2, further comprising a first low voltage (LV) device integrated on the semiconductor substrate; wherein a working voltage of the MV device is greater than a working voltage of the first LV device;
wherein the first LV device comprises a second gate structure, wherein the second gate structure comprises a second gate dielectric layer and a second gate conductive material layer stacked together;
wherein second spacers are arranged on side faces of the second gate structure;
wherein a process of making the second spacers is a same as a process of making the first spacers;
a process of making the second gate conductive material layer is a same as a process of making the first gate conductive material layer;
wherein a thickness of the second gate dielectric layer is less than the thickness of the body gate dielectric layer;
wherein the second gate dielectric layer undergoes an etching to reduce the thickness of the body gate dielectric layer, etching and wherein a difference between the thickness of the edge gate dielectric layer and the thickness of the body gate dielectric layer is greater than or equal to the thickness of the second gate dielectric layer.

5. The MV device according to claim 4, further comprising a second LV device integrated on the semiconductor substrate; wherein the working voltage of the first LV device is greater than a working voltage of the second LV device;
wherein the second LV device comprises a third gate structure, comprising a third gate dielectric layer and a third gate conductive material layer stacked together, and third spacers arranged on side faces of the third gate structure;

wherein a process of making the third spacers is a same as the process of making the first spacers;

wherein a process of making the third gate conductive material layer is a same as the process of making the first gate conductive material layer;

wherein a thickness of the third gate dielectric layer is less than the thickness of the second gate dielectric layer.

6. The MV device according to claim 5, wherein the second LV device is repeatedly arranged at a first pitch, wherein an integration level is improved by reducing the first pitch, and when the first pitch becomes smaller, the thicknesses of the first spacers, the second spacers, and the third spacers become smaller.

7. The MV device according to claim 5, wherein a material of the first gate dielectric layer comprises an oxide;

a material of the second gate dielectric layer comprises an oxide; and a material of the third gate dielectric layer comprises an oxide.

8. The MV device according to claim 5, wherein the first gate conductive material layer comprises a polysilicon gate.

9. A method for manufacturing an MV device, comprising following steps:

step 1, providing a semiconductor substrate, forming a field oxide layer on the semiconductor substrate, forming a first active region comprising a formation region of the MV device, wherein the first active region is surrounded by the field oxide layer; forming two lightly doped drain regions in selected regions of the first active region;

forming a channel region on a surface of the semiconductor substrate between the two lightly doped drain regions;

step 2, growing a first gate dielectric layer, and performing a first etching on the first gate dielectric layer, wherein after the first etching, the first gate dielectric layer covers a surface of the first active region;

step 3, performing a second etching, wherein the second etching patterns the first gate dielectric layer into a thinned body gate dielectric layer in a middle region of a formation region of a first gate structure and an un-thinned edge gate dielectric layer, and reduces a thickness of the first gate dielectric layer, and wherein the edge gate dielectric layer surrounds a periphery of the body gate dielectric layer;

wherein along a channel length direction, the two lightly doped drain regions extend to a bottom of the body gate dielectric layer respectively, and wherein a top of the channel region is covered by the body gate dielectric layer;

wherein a threshold voltage of the MV device is determined by the thickness of the body gate dielectric layer, wherein by increasing the thickness of the edge gate dielectric layer, a leakage of the MV device is reduced without an impact on the threshold voltage of the MV device;

step 4, growing a gate conductive material layer, and performing a third etching, wherein in the formation region of the MV device, the gate conductive material layer and the first gate dielectric layer are both located in the formation region of the first gate structure after the third etching, wherein the gate conductive material layer in the formation region of the first gate structure serves as a first gate conductive material layer, and the first gate structure is formed by stacking the first gate dielectric layer and the first gate conductive material layer;

side faces of the first gate structure comprise a first side face, a second side face, a third side face, and a fourth side face, wherein the first side face and the second side face of the first gate structure are located in the channel length direction, and wherein the third side face and the fourth side face of the first gate structure are located in a channel width direction;

step 5, performing a spacer process to form first spacers on the side faces of the first gate structure; and step 6, performing a self-aligned source drain implant to form first source drain regions on surfaces of the lightly doped drain regions outside the first spacers at the first side face and the second side face of the first gate structure.

10. The method for manufacturing the MV device according to claim 9, wherein the third side face and the fourth side face of the first gate structure extend to a top of the field oxide layer outside the first active region respectively along the channel width direction in step 4, wherein the body gate dielectric layer is located in the active region, and wherein the edge gate dielectric layer is located on a surface of the active region between an outer edge of the body gate dielectric layer and an outer edge of the active region.

11. The method for manufacturing the MV device according to claim 9, further comprising:

forming a first LV device integrated into the semiconductor substrate, wherein a working voltage of the MV device is greater than a working voltage of the first LV device;

removing the first gate dielectric layer from a formation region of the first LV device after the first etching in step 2;

growing a second gate dielectric layer before step 3, wherein a thickness of the second gate dielectric layer is less than the thickness of the body gate dielectric layer; in step 3, the second etching in step 3 simultaneously etches the second gate dielectric layer, wherein the second gate dielectric layer in the formation region of the first LV device is retained after the second etching;

in step 4, wherein the gate conductive material layer and the second gate dielectric layer in the formation region of the first LV device are both located in a formation region of a second gate structure of the first LV device after the third etching, wherein the gate conductive material layer located in the formation region of the second gate structure serves as a second gate conductive material layer, and wherein the second gate structure is formed by stacking the second gate dielectric layer and the second gate conductive material layer;

forming second spacers on side faces of the second gate structure in the spacer process in step 5 simultaneously; and performing the self-aligned source drain implant in step 6 simultaneously to form second source drain regions on a surface of the semiconductor substrate outside the second spacers at a first side face and a second side face of the second gate structure.

12. The method for manufacturing the MV device according to claim 11, further forming a second LV device integrated on the semiconductor substrate, wherein a working voltage of the first LV device is greater than a working voltage of the second LV device;

removing the first gate dielectric layer from a formation region of the second LV device after the first etching in step 2;

removing the second gate dielectric layer from the formation region of the second LV device after the second etching in step 3;

growing a third gate dielectric layer after step 3 and before step 4, wherein a thickness of the third gate dielectric layer is less than the thickness of the second gate dielectric layer; and in step 4, wherein the gate conductive material layer and the third gate dielectric layer in the formation region of the second LV device are both located in a formation region of a third gate structure of the second LV device after the third etching, the gate conductive material layer located in the formation region of the third gate structure serves as a third gate conductive material layer, and wherein the third gate structure is formed by stacking the third gate dielectric layer and the third gate conductive material layer;

forming third spacers on all side faces of the third gate structure simultaneously in the spacer process in step 5; and performing the source drain implant in step 6 simultaneously to form third source drain regions on surfaces of the semiconductor substrate outside the third spacers at a first side face and a second side face of the third gate structure.

13. The method for manufacturing the MV device according to claim 12, wherein in the formation region of the second LV device, the second LV device is repeatedly arranged according to a first pitch, wherein an integration level is improved by reducing the first pitch, wherein when the first pitch becomes smaller, the thicknesses of the first spacers, the second spacers, and the third spacers become smaller.

14. The method for manufacturing the MV device according to claim 12, wherein a material of the first gate dielectric layer comprises an oxide;
a material of the second gate dielectric layer comprises an oxide; and
a material of the third gate dielectric layer comprises an oxide.

15. The method for manufacturing the MV device according to claim 12, wherein the gate conductive material layer in step 4 comprises a polysilicon gate.

* * * * *